United States Patent [19]

Tateishi et al.

[11] Patent Number: 4,675,096
[45] Date of Patent: Jun. 23, 1987

[54] CONTINUOUS SPUTTERING APPARATUS

[75] Inventors: Hideki Tateishi; Tamotsu Shimizu; Susumu Aiuchi; Katsuhiro Iwashita, all of Yokohama; Hiroshi Nakamura, Fuchu, all of Japan

[73] Assignee: Hitachi, Ltd., Tokyo, Japan

[21] Appl. No.: 645,671

[22] Filed: Aug. 30, 1984

[30] Foreign Application Priority Data

Sep. 2, 1983 [JP] Japan .................. 58-160388

[51] Int. Cl.[4] ............................................ C23C 14/36
[52] U.S. Cl. ................................ 204/298; 204/192.12; 204/192.32
[58] Field of Search ................ 204/192 R, 298; 156/643, 345

[56] References Cited

U.S. PATENT DOCUMENTS 3,981,791 9/1976 Rosvold ......................... 204/298
4,274,936 6/1981 Love ........................... 204/192 R
4,311,427 1/1982 Coad et al. ........................ 414/217
4,379,743 4/1983 Nakatsukasa et al. .............. 204/298
4,405,435 9/1983 Tateishi et al. ................... 204/298

Primary Examiner—John F. Niebling
Assistant Examiner—William T. Leader
Attorney, Agent, or Firm—Antonelli, Terry & Wands

[57] ABSTRACT

A continuous sputtering apparatus comprising a main vacuum chamber, one loading station and a plurality of process stations capable of having their pressures controlled separately. The process station includes a sub vacuum chamber capable of being in communication with the main vacuum chamber through an opening and an evacuation port. The loading station and the process stations are arranged to be spaced with equal angles. Substrate holders are provided to face the stations and are rotated by said equal angle in a time. The substrate holder opens and closes the opening of the sub vacuum chamber to serve as a gate valve.

9 Claims, 4 Drawing Figures

CONTINUOUS SPUTTERING APPARATUS

BACKGROUND OF THE INVENTION

The invention relates to a continuous sputtering apparatus capable of producing element thin films of semiconductor devices, devices for communication system and the like by continuously conducting a plurality of processes in a vacuum.

DESCRIPTION OF THE PRIOR ART

Continuous sputtering apparatus of the prior art including a plurality of process stations are disclosed in, for example, Japanese Patent Application Laid-Open No. 100440/1981 (based on U.S. Ser. No. 106,342), Japanese Patent Application Laid-Open No. 103441/1981 (based on U.S. Ser. No. 106,179) and Japanese Patent Application Laid-Open No. 103442/1981 (based on U.S. Ser. No. 106,343). In continuous sputtering apparatus disclosed in these publications, a pressure of each process station is not independently controlled from other process stations and becomes substantially the same pressure as the other process stations. Since the optimum working pressure of a sputter-deposition process differs from that of a sputter-etching process, a disadvantage of the above described continuous sputtering apparatus resides in fact that such apparatus has a low process speed and, poor quality of produced films as compared with the sputter-deposition process and the sputter-etching process in the optimum working pressures separately. Further, in the prior art, since the process stations are in communication with each other and are evacuated by a single main vacuum pump, impure gases produced in a substrate baking process station and the sputter-etching process station would reach the sputter-deposition process station, resulting in poor quality of produced films.

Additionally, a target, which is a source of the produced film, of the sputter-deposition process station is consumed and must be exchanged for a new target at regular intervals. In the above continuous sputtering apparatus of the prior art, an atmospheric pressure is introduced in a vacuum vessel during the target exchange, and thus it takes a long time to evacuate the vacuum vessel to once again secure a clean high vacuum. As a result, an operation rate of the apparatus is reduced and thus an effective productivity of the apparatus is reduced.

An object of the invention is to provide a continuous sputtering apparatus capable of controlling a pressure of each process station separately.

Another object of the invention is to provide a continuous sputtering apparatus wherein impure gases produced in any process stations do not reach the other process stations.

Further another object of the invention is to provide a continuous sputtering apparatus capable of introducing an atmospheric pressure into only the sputter-deposition process station during a target of this station is exchanged for new one.

In accordance with advantageous features of the present invention, a continuous sputtering apparatus is provided which includes at least two process stations each having a sub vacuum chamber, gas introduction means connected to the sub vacuum chamber, an opening making a communication between the sub vacuum chamber and a main vacuum chamber, an evacuation port making a communication between the sub vacuum chamber and the main vacuum chamber, valve means for opening and closing the evacuation port and one of a sputter-deposition unit and a sputter-etching unit; and substrate transfer means including drive means for pushing substrate holders air tightly against the openings of the process stations and for separating the substrate holders from the openings, so that the substrate holders serve as gate valves between the sub vacuum chambers and the main vacuum chamber.

According to the invention, a pressure of each process station is separately controlled, and thus the sputter-deposition and the sputter-etching are performed in the optimum working pressures. Further, since the substrate holders serve as the gate valves between the sub vacuum chambers and the main vacuum chamber, impure gases produced in any process stations do not reach other process stations and an atmospheric pressure is introduced into only the sputter-deposition process station during the target exchange.

Other features and advantages of the invention will be apparent from the description of the embodiments mentioned below and the accompanying drawings.

DETAILED DESCRIPTION

Before stating embodiments of the invention, one example of the above prior art will be explained in detail by referring to the accompanying drawings.

Figure 1:
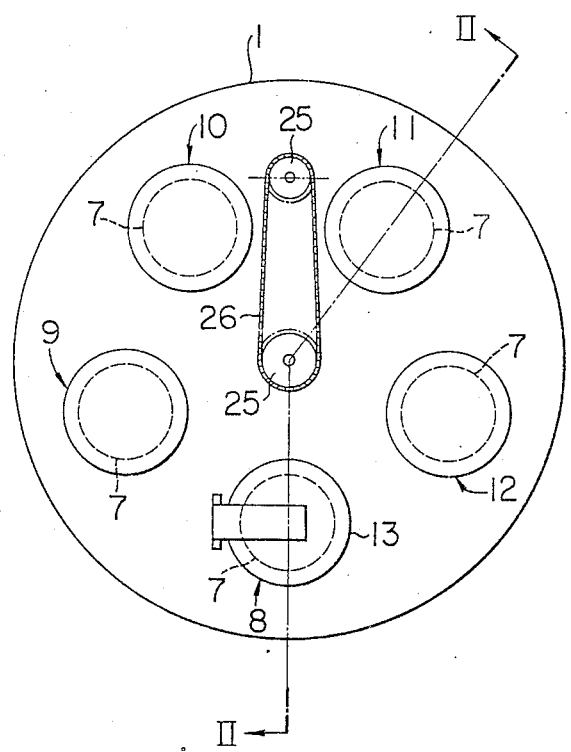
FIG. 1 is a front view of a continuous sputtering apparatus of the prior art.
Figure 2:
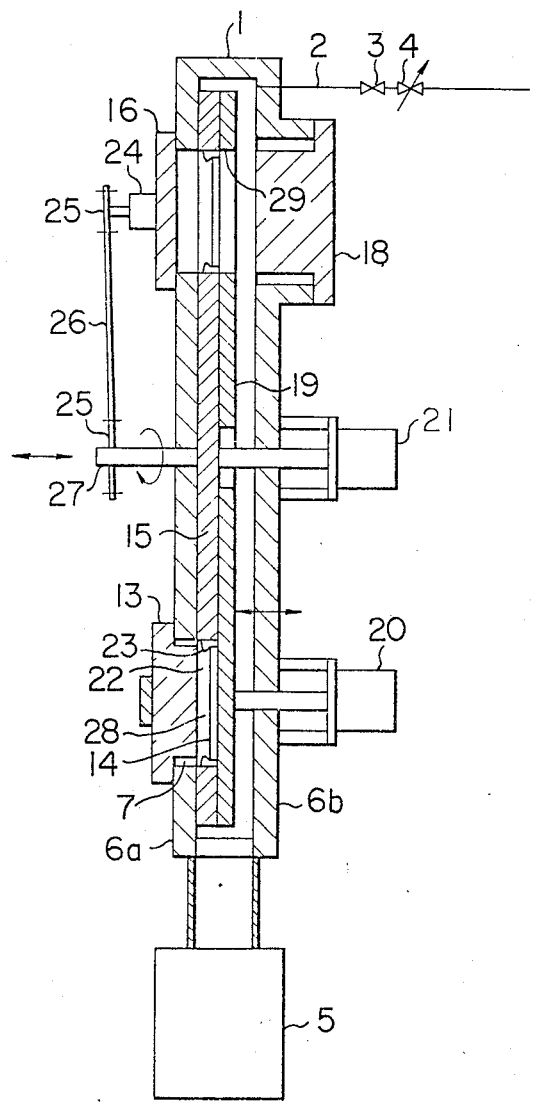
FIG. 2 is a sectional view taken along a line II—II of FIG. 1.

In FIG. 1, an upward direction corresponds to the vertically upward direction. In FIG. 2, a leftward direction is called "front" and a rightward direction is called "rear" for convenience of explanation.

As shown in FIGS. 1 and 2, a vacuum vessel 1 of a thin cylindrical form has connected thereto a gas line 2, a vacuum valve 3, a variable valve 4 and a vacuum pump 5. The vacuum vessel also includes a front wall 6a and a rear wall 6b.

A plurality of openings 7 are provided in the front wall 6a at the same radial distance a loading station generally designated by the reference numeral 8, first process station generally designated by the reference numeral 9, second process station generally designated by the reference numeral 10, third process station generally designated by the reference numeral 11 and fourth process station generally designated by the reference numeral 12 are as shown in FIG. 1, respectively arranged at the openings 7.

The loading station 8 is provided with a door 13, with catches 23, as shown in FIG. 2, being adapted to mount a substrate 14 separate from a transfer plate 15. The catches 23 are disposed at a circumference of a substrate holding hole 22 of the circular transfer plate 15 which is provided adjacent to the front wall 6a.

The rear wall 6b of the vacuum vessel 1 is provided with an air cylinder 20 at a position corresponding to the loading station, with the air cylinder 20 being adapted to push a pressure plate 19 toward the transfer plate 15. The central portion of the rear wall 6b is provided with an air cylinder 21 for driving the transfer plate 15 in the forward and rearward direction.

The transfer plate 15 is formed with substrate holding holes 22 equally spaced from each other and arranged on a circle having the same radius as a circle on which the openings 7 are arranged. The transfer plate 15 is rotated by a combination of a motor 24 provided on the front wall 6a, sprocket wheels 25, a chain 26 during not being pressed by the pressure plate 19. A shaft 27 mounted on an central axis of the transfer plate 15 and extending frontward and rearward from the transfer plate 15 is airtightly sealed with the walls 6a and 6b of the vacuum vessel 1. The pressure plate 19, disposed in the vacuum vessel 1, is movable in the forward and rearward direction by an action of the air cylinder 20. A vacuum preparatory chamber 28 is defined by a cooperation of the door 13, the opening 7 of the loading station 8, the substrate holding hole 22 of the transfer plate 15 and the pressure plate 19. The pressure plate 19 is formed with openings 29 at positions corresponding to the first to the fourth process stations 9–12 of the front wall 6a with each process station 9–12 being provided with a sputter-deposition unit or a blind lid 16.

The continuous sputtering apparatus mentioned above operates as follows:

After evacuating the vacuum chamber 1 to a high vacuum by the vacuum pump 5, the vacuum valve 3 is opened and an argon gas is introduced into the vacuum chamber 1 through the gas line 2. A pressure of the vacuum chamber 1 is controlled in any preferred low level by regulating the variable valve 4. The transfer plate 15 is pressed against the front wall 6a of the vacuum chamber 1 by the air cylinder 21 and the pressure plate 19 is pressed against the transfer plate 15 by the air cylinder 20, to form the vacuum preparatory chamber 28 in the loading station 8. After the vacuum preparatory chamber 28 is released to the atmospheric pressure by leak means (not shown), the door 13 is opened and a processed substrate 14 is removed by carrier means (not shown) and further a new substrate is mounted on the catches 23 in the substrate holding hole 22 of the transfer plate 15. The door 13 is closed and the vacuum preparatory chamber 28 is roughly evacuated by rough evacuation means (not shown). The pressure plate 19, the transfer plate 15 and the front wall 6a are separated from each other by the air cylinders 20, 21. After the transfer plate 15 is rotated by an inter-station angle by cooperation of the motor 24, the sprocket wheels 25 and the chain 26, the front wall 6a, the transfer plate 15 and the pressure plate 19 are brought in intimate contact with each other again by the air cylinder 20, 21. Next, in the loading station 8, the above operations are repeated and in the first to the fourth process stations necessary processes are performed on the substrate 14.

Repeating the above operations, the sputtering processes on the substrate are performed continuously one by one.

Processes in the process stations may include a baking process wherein the substrate 14 is heated in a vacuum for removing impure gases adhered to a surface of the substrate 14, a sputter-etching process wherein argon ions collide against the surface of the substrate 14 to remove a surface layer of the substrate 14, and a sputter-deposition process wherein thin films are produced on the surface of the substrate 14.

In the normal order of the processes, the first process station 9 performs the baking process or the sputter-etching process, the second process station 10 performs the sputter-etching process or the baking process, and the third and the fourth process stations 11, 12 perform the sputter-deposition process.

Figure 3:
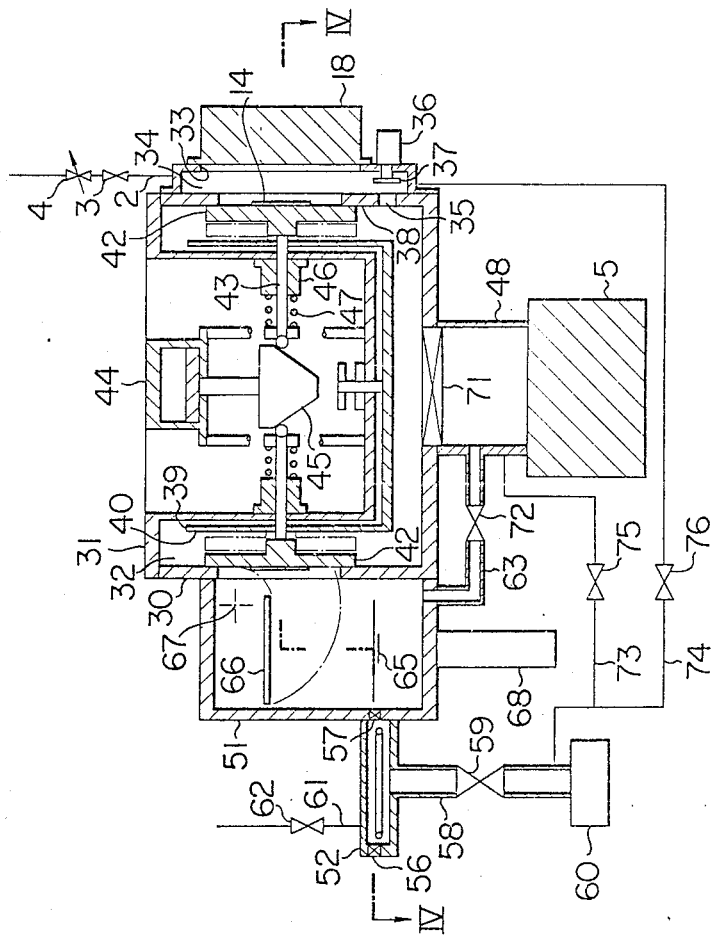
FIG. 3 is a vertical sectional view of one embodiment of a continuous sputtering apparatus of the invention and is a sectional view taken along a line III—III of FIG. 4.
Figure 4:
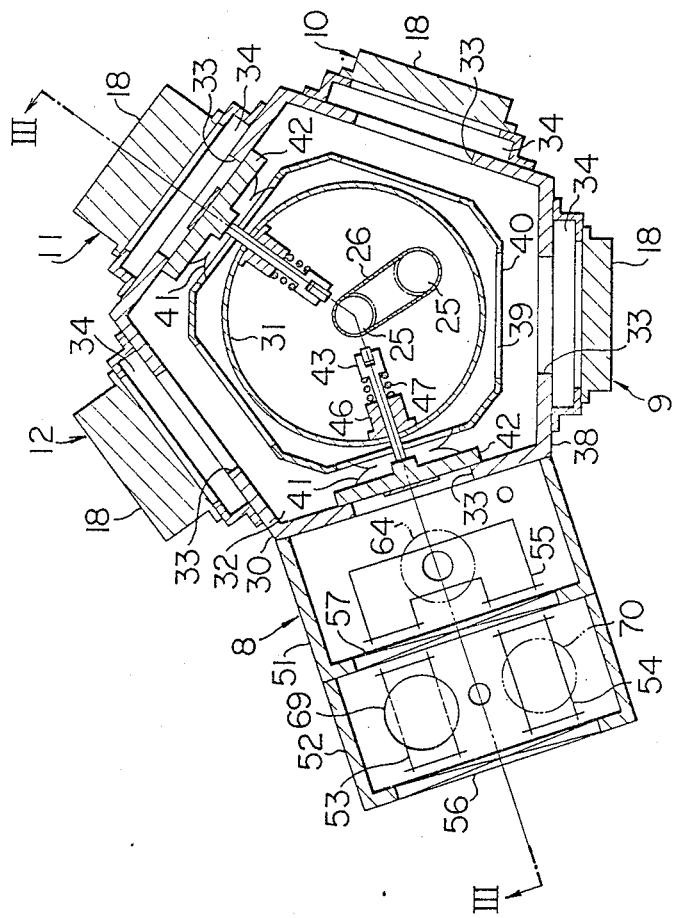
FIG. 4 is a horizontal sectional view taken along a line IV—IV of FIG. 3.

As shown in FIGS. 3 and 4, in accordance with the present invention, a main vacuum chamber 32 is defined by a pentagonal vacuum vessel 30 and a lid 31 formed with a cylindrical recess in the central portion, with a wall 38 of the vacuum vessel 30 being provided with openings 33 which are spaced with equal angles and have the central axis in the same horizontal plane. A loading station 8 is respectively disposed at the openings of the first to the fourth process stations 9–12 in order. A loading chamber 51 and a take-in-and-out chamber 52 is provided at the atmosphere side of the loading station 8. Sub vacuum chambers 34 are formed outside the openings 33 of the first to the fourth process stations 9–12. The sub vacuum chambers 34 and the main vacuum chamber 32 communicate with each other through evacuation ports 35 and also through the openings 33 as shown in FIG. 3. The evacuation ports 35 are opened and closed by valves 37 which are driven by air cylinders 36.

As shown in FIG. 4, a drum 39 is provided between the vacuum vessel 30 and the lid 31 with the drum 39 having a plurality of flat surfaces 40 substantially parallel to the wall 38 of the vacuum vessel 30. The drum 39 is rotatably supported at the center of the bottom of the lid 31 and is rotated by a motor (not shown), sprocket wheels 25 and a chain 26.

Each flat surface 40 of the drum 39 is provided with a substrate holder 42 connected to the drum through a pair of leaf springs 41 and is movable back and forth in maintaining itself substantially parallel to the flat surface 40. The substrate holder 42 airtightly contacts the wall 38 of the vacuum vessel 30 when a pusher 43 contacts the substrate holder 42. When a conical cam 45 is lowered by an air cylinder 44 (FIG. 3) mounted on the center of the recess of the lid 31, the pushers 43 are moved outward and guided in guide members 46 to push the substrate holders 42 against the wall 38 at the all stations at the same time. When the conical cam 45 ascends, the pushers 43 are withdrawn by compression coil springs 47 so that outer ends of the pushers 43 are withdrawn to an outer peripheral surface of the recess of the lid 31, and further the substrate holders 43 are separated from the wall 38 and approach the drum 39 by actions of the leaf springs 41 (FIG. 4).

In FIG. 4, it should be understood that the pushers 43, the guide members 46, the substrate holders 42 and the leaf springs 47 are omitted from the drawings in the first, the second and the fourth process stations 9, 10, 12.

As shown in FIG. 3, at least two sub vacuum chambers 34 each has a process unit 18, a gas line 2, a vacuum valve 3 and a variable valve 4. These components are same or like ones as in the prior art apparatus shown in FIG. 2.

The main vacuum chamber 32 is connected to a vacuum pump 5 through a main valve 71 and a pipe 48 and evacuated to a high vacuum.

The loading station 51 is provided at the atmosphere side of the loading station 8, and the take-in-and-out chamber 52 is provided at the atmosphere side of the loading chamber 51. Two sets of carrier means 53, 54 are provided in the take-in-and-out chamber 52 and one set of carrier means 55 is provided in the loading chamber 51.

Two gate valves 56, 57 are provided on both sides of the take-in-and-out chamber 52. When the gate valve 56 is opened, the substrate 14 is taken in into the take-in-and-out chamber 51 by carrier means (not shown) provided in the atmosphere. When the gate valve 56 is closed and the gate valve 57 is opened, the substrate 14 is transferred from the chamber 52 to the chamber 51 or from the chamber 51 to the chamber 52 by the carrier means 53, 54, 55.

The take-in-and-out chamber 52 is, as shown in FIG. 3, connected to an auxiliary vacuum pump 60 through a vacuum pipe 58 and a vacuum valve 59 and is connected to a source of a leak gas (not shown) through a leak line 61 and a leak valve 62.

The loading chamber 51 is connected to the vacuum pump 5 through a bypass pipe 63, a valve 72 and the pipe 48.

When the substrate 14 is in the loading position 64 (FIG. 4) in the loading chamber 51, the substrate 14 is lifted by an elevator 65 shown in FIG. 3 and held on an arm 66 (FIG. 3). A holding mechanism is omitted from the drawings. The arm 66 is rotated around an axis 67 (shown as a cross of lines), and the substrate 14 is transferred to the substrate holder 42. The elevator 65 is driven by an air cylinder 68 and the arm 66 is driven by a motor (not shown).

Rough evacuation pipes 73 and 74 are connected between the vacuum pump 5 and the auxiliary vaccum pump 60 and between the sub vacuum chambers 34 and the auxiliary vacuum pump 60 for roughly evacuating the non-operated vacuum pump 5 and the sub vacuum chamber 34. Valves 75 and 76 are provided midway of the rough evacuation pipes 73 and 74.

A cryo-pump is used for the vacuum pump 5 and an oil rotary pump is used for the auxiliary vacuum pump 60. The substrate holder 42 is designed for four inch wafers, but can be modified for five or six inch wafers.

Next, an operation of the continuous sputtering apparatus constructed above will be described.

The substrate holder 42 is maintained pressed against the wall 38 of the vacuum vessel 30 in each station by holding the conical cam 45 in the lower position by the air cylinder 44. The vacuum pump 5 is operated in the condition that the valve 37 is opened by the air cylinder 36, and the argon gas is introduced into the sub vacuum chamber 34 of the sputter-deposition and the sputter-etching stations through the gas line 2 by regulating the vacuum valve 3 and the variable valve 4, to maintain pressures of the sub vacuum chambers 34 and the main vacuum chamber 32 predetermined low levels. The pressure of the sub vacuum chamber 34 is controlled by regulating a degree of opening of the variable valve 4 and by modifying a diameter of the evacuation port 35.

The gate valves 56 and 57 and the vacuum valve 59 are closed, and the leak valve 62 is opened to introduce a leak gas (dry nytrogen gas) into the take-in-and-out chamber 52 to the atmospheric pressure.

The loading chamber 51 is evacuated to a pressure of the order of $10^{-7}$ Torr by using the bypass pipe 63. The elevator 65 is in the lowest position in the loading chamber 51.

The operation cycle starts from the above conditions.

The gate valve 56 of the take-in-and-out chamber 52 is opened. The substrate 14 is carried to the take-in position 69 by cooperation of the carrier means provided in the atmosphere (not shown) and the carrier means 53. And then the gate valve 56 is closed.

The auxiliary vacuum pump 60 is operated. The vacuum valve 59 is opened to evacuate the take-in-and-out chamber 52 to 0.1 Torr for example, and thereafter the gate valve 57 is opened. The substrate 14 is transferred to the loading position 64 by cooperation of the carrier means 53 and 55. And then the substrate 14 is mounted on the substrate holder 42 by cooperation of the elevator 65 and the arm 66.

The conical cam 45 is raised and the pushers 43 are moved inward by the compression coil springs 47 and the substrate holders 42 are also moved inward by the leaf springs 41. The drum 39 is rotated by one inter-station angle by cooperation of the motor, the sprocket wheels 25 and the chain 26. The substrate holders 42 are pressed against the wall 38 of the vacuum vessel 30 again by cooperation of the air cylinder 44, the conical cam 45 and the pushers 43. The processed substrate 14 mounted on the substrate holder 42 is transferred to the carrier means 55 by cooperation of the arm 66 and the elevator 65 in the loading station 8. After opening the gate valve 57, the substrate 14 is carried to the take-out position 70 in the take-in-and-out chamber 52 by cooperation of the carrier means 53 and 54. And then a new substrate 14 is carried from the take-in position 69 to the loading position 64 and the gate valve 57 is closed.

As described above, after releasing the take-in-and-out chamber 52 to the atmosphere and opening the gate valve 56, the new substrate 14 is simultaneously taken in while and taking out the processed substrate 14 is removed from the take-out position 70.

During the taking-in and taking-out processes in the loading station 8, the substrates 14 are subjected to the predetermined processes in the first to the fourth process stations.

A wafer baking process is performed in the first process station is performed the for removing impure gases adhered to the wafer surface. A sputter etching process is performed in the second process station for removing oxide layers of the wafer surface before the sputter-deposition. In the third process station is performed the sputter-deposition process for forming thin films on the wafer. Another sputter-deposition process can be performed in the fourth process station using another target material. Stating concretely, the target material of the third process station is $M_oS_{i2}$ for gate electrodes of LSI memories and the target material of the fourth process station is aluminum alloy for wiring films. It is noted, however, that the above two sputter-deposition processes are not continuously performed on the same wafer.

In selecting the above processes, the process units 18 of the respective process stations are a wafer baking unit in the first process station, a sputter-etching unit in the second process station, sputter-deposition units in the third and the fourth process stations.

Argon gas pressures of the respective chambers of the above embodiment is as follows:

main vacuum chamber: 1 mTorr
sub vacuum chamber of the first process station: 1 mTorr
sub vacuum: chamber of the second process station: 8 mTorr
sub vacuum chambers of the third and fourth process stations: 2 mTorr Repeating the above operations, a number of the substrates 14 are separately and continuously subjected to the sputtering processes.

The target of the sputter-deposition process is consumed. The target exchange is performed in the following manner.

The five substrate holders 42 are pressed against the wall 38 by cooperating the air cylinder 44, the conical cam 45 and the pushers 43. The valve 37 of the station at which the target should be exchanged is closed for a new target by the action of the air cylinder 36 thereof, to airtightly seal the pertinent sub vacuum chamber 34 with respect to the main vacuum chamber 32. The sub vacuum chamber 34 is released to the atmospheric pressure by leak means (not shown). And then the sputtering electrode of the process unit 18 of the station is taken out and the target is exchanged for new one. After the target exchange, the sputtering electrode is assembled and the sub vacuum chamber 34 is roughly evacuated by the rough evacuation means 74, 76. Next, the substrate holders 42 are withdrawn to evacuate the sub vacuum chamber 34 to a high vacuum.

According to the invention, as seen from the above description, it is sufficient for the target exchange to introduce the atmospheric pressure into only the pertinent sub vacuum chamber 34 of the station at which the target should be exchanged for new one with the main vacuum chamber 32 being under evacuation in a high vacuum.

While the above embodiment has five stations including one loading stations and four process stations, any number of the stations may be provided in performing the invention.

The above embodiment has the loading chamber 51 and the take-in-and-out chamber 52 in the loading station 8. The loading chamber 51, however, may be omitted and thus the take-in-and-out chamber 52 may be directly connected to the main vacuum chamber 32. In this case, the elevator 65 and the loading arm 66 are to be provided in the take-in-and-out chamber 52. This modification has a similar effect as the above embodiment.

The above embodiment of the invention has one set of the main evacuation system. And in the embodiment the pressure of each sub vacuum chamber is separately controlled by providing each process station with the sub vacuum chamber. As a result, the optimum pressure can be set in each process to improve the process speed and the film quality. Further, the impure gases produced in the baking process station and the sputter-etching process station are discharged from the evacuation ports into the main vacuum chamber and finally to the vacuum pump. It is noted that the impure gases discharged into the main vacuum chamber hardly enter other sub vacuum chambers through the evacuation ports thereof. This entrance probability of the impure gases into the other sub vacuum chambers would be practically negligible. Namely, it would be neglected that the impure gases affect the sputter-deposition process.

The embodiment includes the substrate holders 42 rotatable around the vertical axis and thus the substrates 14 rotate in the horizontal plane. Accordingly, adhesion of dust to the substrate, is avoided, the dust coming down from upward, as compared with the prior art including the substrate holder rotatable in the vertical plane.

According to the invention, since the mechanism in the main vacuum chamber does not touch come into contact with the atmosphere, the substrate holder, which is subjected to a high temperature in the baking process station, is not cooled by the atmosphere. As a result, there is avoided scaling off the deposited film on the substrate holder, the scaling off being caused by repeating heating and cooling. Since the mechanism in the main vacuum chamber does not come in contact with the atmosphere, there is a reduction in the entrance of gases involved in the atmosphere into the main vacuum chamber, these gases being undesirable for the sputter-deposition process.

What is claimed is:

1. A continuous sputtering apparatus comprising:
   a vacuum vessel forming a main vacuum chamber;
   evacuation means connected to the vacuum vessel;
   a plurality of stations including one loading station and a plurality of process stations spaced at equal angles on a wall of the vacuum vessel; and
   substrate transfer means including substrate holders, which are same in number as the stations and face the stations, and enabling the substrate holders to simultaneously rotate by said equal angle in the main vacuum chamber, characterized in that:
   at least two of said process stations each includes a sub vacuum chamber, gas introduction means connected to each sub vacuum chamber, an opening for communication between the sub vacuum chamber and the main vacuum chamber, said opening being provided for enabling a processing of a wafer, an evacuation port for communication between the sub vacuum chamber and the main vacuum chamber, valve means for opening and closing the evacuation port and one of a sputter-deposition unit and a sputter-etching unit; and
   said substrate transfer means includes drive means for pushing the substrate holders air-tightly against the openings of each process station and for separating the substrate holders from the openings, so that the substrate holders serve as gate valves between the sub vacuum chambers and the main vacuum chamber.

2. A continuous sputtering apparatus as claimed in claim 1, wherein said substrate transfer means enables the substrate holders to rotate around a vertical axis.

3. A continuous sputtering apparatus as claimed in claim 1, wherein said loading station includes a take-in-and-out chamber capable of being evacuated, substrate carrier means provided in the take-in-and-out chamber and loading means for transferring the substrate between the substrate carrier means and the substrate holder.

4. A continuous sputtering apparatus as claimed in claim 3, wherein said loading means includes a loading chamber provided between the vacuum vessel and the take-in-and-out chamber.

5. A continuous sputtering apparatus as claimed in claim 4, wherein said evacuation means and said loading chamber are connected to each other through a bypass pipe.

6. A continuous sputtering apparatus as claimed in claim 1, comprising four process stations each including a sub vacuum chamber, the process stations having, respectively in order, a substrate baking unit, a sputter-etching unit, a sputter-deposition unit and a sputter-deposition unit.

7. A continuous sputtering apparatus as claimed in claim 6, wherein said vacuum vessel has a horizontal cross section of pentagonal shape.

8. A continuous sputtering apparatus as claimed in claim 1, wherein said drive means includes a conical cam movable upward and downward on a central axis of rotation of the substrate holders, pushers movable horizontally by being pressed against the conical cam by compression coil springs to push the substrate holders outward and leaf springs pulling the substrate holders inward.

9. A continuous sputtering apparatus comprising:
- a main vacuum chamber having a cross section of a substantially regular polygonal shape;
- at least two sub vacuum chambers each of which is provided on a side wall of the main vacuum chamber and is provided with an opening capable of communicating with the main vacuum chamber, said opening being provided for enabling a processing for a wafer;
- a wafer holder arranged in the main vacuum chamber and capable of being rotated around an axis of the main vacuum chamber and being moved in a direction perpendiuclar to the axis of the main vacuum chamber so as to air tightly seal the opening of the sub vacuum chamber; and
- evacuation means for regulating a pressure level of the sub vacuum chamber, each evacuation means including an evacuation port, an air cylinder, and a valve.

* * * * *